(12) United States Patent
Baseman et al.

(10) Patent No.: US 7,114,240 B2
(45) Date of Patent: Oct. 3, 2006

(54) METHOD FOR FABRICATING GIANT MAGNETORESISTIVE (GMR) DEVICES

(75) Inventors: Daniel L. Baseman, Minneapolis, MN (US); Lonny L. Berg, Elk River, MN (US); Romney R. Katti, Maple Grove, MN (US); Daniel S. Reed, Maple Plain, MN (US); Gordon A. Shaw, Plymouth, MN (US); Wei D. Z. Zou, Minnetonka, MN (US)

(73) Assignee: Honeywell International, Inc., Morristown, NJ (US)

( * ) Notice: Subject to any disclaimer, the term of this patent is extended or adjusted under 35 U.S.C. 154(b) by 358 days.

(21) Appl. No.: 10/706,531

(22) Filed: Nov. 12, 2003

(65) Prior Publication Data

US 2005/0097725 A1    May 12, 2005

(51) Int. Cl.
*G11B 5/127* (2006.01)
*H04R 31/00* (2006.01)

(52) U.S. Cl. ............... 29/603.15; 29/603.07; 29/603.13; 29/603.14; 29/603.16; 29/603.18; 216/22; 216/48; 216/65; 360/316; 360/324.11; 360/324.12; 360/324.2; 427/127; 427/128; 451/5; 451/41

(58) Field of Classification Search ............ 29/603.07, 29/603.13–603.16, 603.18; 216/22, 48, 65; 360/316, 324.1, 324.11, 324.12, 324.2; 427/127, 427/128; 451/5, 41
See application file for complete search history.

(56) References Cited

U.S. PATENT DOCUMENTS

| | | | |
|---|---|---|---|
| 5,496,759 A | 3/1996 | Yue et al. | |
| 5,569,617 A * | 10/1996 | Yeh et al. | 438/3 |
| 5,861,328 A | 1/1999 | Tehrani et al. | |
| 5,940,319 A | 8/1999 | Durlam et al. | |
| 6,048,739 A | 4/2000 | Hurst et al. | |
| 6,153,443 A | 11/2000 | Durlam et al. | |
| 6,165,803 A | 12/2000 | Chen et al. | |
| 6,174,737 B1 | 1/2001 | Durlam et al. | |
| 6,211,090 B1 | 4/2001 | Durlam et al. | |

(Continued)

FOREIGN PATENT DOCUMENTS

EP    1 033 764    3/2000

OTHER PUBLICATIONS

"Dual layer overcoat for MR recording media"; Ga-Lane Chen; Junhoa Wu; Weiss, J.; Magnetics, IEEE Transactions on vol. 35, Issue 5, Part 1; Sep. 1999; pp. 2364-2366.*

(Continued)

*Primary Examiner*—Paul D. Kim
(74) *Attorney, Agent, or Firm*—McDonnell Boehnen Hulbert & Berghoff, LLP

(57) ABSTRACT

In a method of fabricating a giant magnetoresistive (GMR) device a plurality of magnetoresistive device layers is deposited on a first silicon nitride layer formed on a silicon oxide layer. An etch stop is formed on the magnetoresistive device layers, and a second layer of silicon nitride is formed on the etch stop. The magnetoresistive device layers are patterned to define a plurality of magnetic bits having sidewalls. The second silicon nitride layer is patterned to define electrical contact portions on the etch stop in each magnetic bit. The sidewalls of the magnetic bits are covered with a photoresist layer. A reactive ion etch (RIE) process is used to etch into the first silicon nitride and silicon oxide layers to expose electrical contacts. The photoresist layer and silicon nitride layers protect the magnetoresistive layers from exposure to oxygen during the etching into the silicon oxide layer.

11 Claims, 7 Drawing Sheets

U.S. PATENT DOCUMENTS

| | | |
|---|---|---|
| 6,392,922 B1 | 5/2002 | Liu et al. |
| 6,500,676 B1 | 12/2002 | Ramberg |
| 6,872,997 B1 * | 3/2005 | Liu et al. .................... 257/295 |
| 2002/0080645 A1 | 6/2002 | Liu et al. |
| 2002/0085412 A1 | 7/2002 | Liu et al. |

OTHER PUBLICATIONS

Geppert, "The New Indelible Memories," IEEE Spectrum Mar. 2003.

* cited by examiner

METHOD FOR FABRICATING GIANT MAGNETORESISTIVE (GMR) DEVICES

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetoresistive devices and, more particularly, to improved methods for fabricating giant magnetoresistive devices, e.g., for magnetic memories.

2. Related Art

The discovery of the giant magnetoresistive (GMR) effect has led to the development of a number of spin-based electronic devices. The GMR effect is observed in certain thin-film devices that are made up of alternating ferromagnetic and nonmagnetic layers. The resistance of a GMR device is lowest when the magnetic moments of the ferromagnetic layers are in a parallel orientation, and the resistance is highest when the magnetic moments are in an antiparallel orientation.

One type of GMR device is commonly referred to as a "spin valve." A spin valve typically includes two ferromagnetic layers that are separated by a thin layer of a nonmagnetic metal, such as copper, and also includes an antiferromagnetic layer that "pins" the magnetization of one of the ferromagnetic layers. Thus, the magnetization of the "pinned" ferromagnetic layer remains generally fixed when moderate magnetic fields are applied. In contrast, the magnetization of the other ferromagnetic layer is relatively "free." Thus, by applying an appropriate magnetic field, the magnetization of the free ferromagnetic layer can be switched while the magnetization of the pinned ferromagnetic layer is unchanged. In this way, applied magnetic fields can change the relative orientations of the magnetizations in the ferromagnetic layers, which, in turn, can be detected as a change in resistance. In particular, the resistance of spin valve 10 is typically lowest when the magnetizations of the ferromagnetic layers are in a parallel orientation and highest when the magnetizations are in an antiparallel orientation.

Another type of GMR device is commonly referred to as a "pseudo spin valve." Like a spin valve, a pseudo spin valve typically includes two ferromagnetic layers that are separated by a layer of a nonmagnetic metal, with the magnetization of one of the ferromagnetic layers staying relatively fixed when moderate magnetic fields are applied.

However, in a pseudo spin valve, this fixed magnetization is a result of a relatively high switching field rather than a result of being pinned. For example, the fixed ferromagnetic layer may be made substantially thicker than the free ferromagnetic layer.

GMR devices, including spin valves and pseudo spin valves, can be used as data storage elements, i.e., "bits," in magnetic random access memory (MRAM) devices. In typical MRAM devices, the logical state of a GMR bit is based on its resistance, which, in turn, is based on the relative orientations of the magnetizations of the ferromagnetic layers. Thus, in one logical state, e.g., a "0" state, a GMR bit may have its ferromagnetic layers in a parallel orientation and, thus, may exhibit a low electrical resistance. In the other logical state, e.g., a "1" state, the GMR bit may its ferromagnetic layers in an antiparallel orientation and, thus, may exhibit a higher electrical resistance. Data may be written to a GMR bit by applying a magnetic field sufficient to change the magnetization of the "free" ferromagnetic layer, In this way, the "free" ferromagnetic layer functions as a "switching layer" that stores data in the form of a particular magnetization orientation relative to the other ferromagnetic layer, the "reference layer."

In general, the process for fabricating GMR bits involves depositing the ferromagnetic layers and other layers that make up the GMR device over one or more underlayers and etching the deposited layers to a desired configuration of GMR bits. Examples of such fabrication processes are described in U.S. Pat. No. 5,496,759 and in U.S. patent application Ser. No. 10/284,922, filed Oct. 31, 2002, which are incorporated herein by reference. However, there continues to be a need for improved methods of fabrication in order to improve yields and/or performance of GMR devices.

SUMMARY

In a first principal aspect, the present invention provides a method of fabrication for a magnetoresistive device. In accordance with the method, an oxide layer is formed, a plurality of magnetoresistive device layers is formed above the oxide layer, and an etch stop is formed above the magnetoresistive device layers. The magnetoresistive device layers are surrounded with an oxygen barrier. The oxide layer is etched while the magnetoresistive device layers are surrounded by the oxygen barrier.

In a second principal aspect, the present invention provides a method of fabrication for a magnetic device. In accordance with the method, an oxide layer is formed, and at least one ferromagnetic layer is formed above the oxide layer. The at least one ferromagnetic layer is surrounded with a barrier to protect the at least one ferromagnetic layer from exposure to oxygen. The oxide layer is etched with the at least one ferromagnetic layer is surrounded by the barrier.

In a third principal aspect, the present invention provides a method of fabrication for a giant magnetoresistive (GMR) device. In accordance with the method, a silicon oxide is layer is formed, a first silicon nitride layer is formed on the silicon oxide layer, and a plurality of GMR device layers is formed on the first silicon nitride layer. The plurality of GMR device layers includes a plurality of ferromagnetic layers and a nonmagnetic layer. An etch stop is formed on the GMR device layers, and a second silicon nitride layer is formed on the etch stop. The GMR device layers are patterned to define sidewalls of the GMR device layers. The second silicon nitride layer is patterned to expose a portion of the etch stop. The sidewalls of the GMR device layers are covered with a photoresist layer. While the sidewalls of the GMR device layers are covered by the photoresist layer, the first silicon nitride layer and the silicon oxide layer are etched to expose at least one electrical contact.

DETAILED DESCRIPTION OF EXEMPLARY EMBODIMENTS

The present invention, in exemplary embodiments, provides methods for fabricating GMR devices, such as spin valves or pseudo spin valves, e.g., as magnetic bits for magnetic memories. In many applications, it is desirable to form the magnetic bits above a layer of silicon oxide, for example, to provide functionality and compatibility with standard fabrication processes. However, it has been found that the process of etching into the silicon oxide can release oxygen that, if allowed to come into contact with the metal layers in the magnetic bits, can degrade the performance of the GMR devices. The present invention addresses this problem by surrounding the magnetic bits with a barrier that protects the metal layers from exposure to oxygen while the silicon oxide layer is being etched. The oxygen barrier may include, for example, one or more photoresist layers and/or silicon nitride layers.

1. Exemplary Spin Valve and Pseudo Spin Valve Constructions

Figure 1:
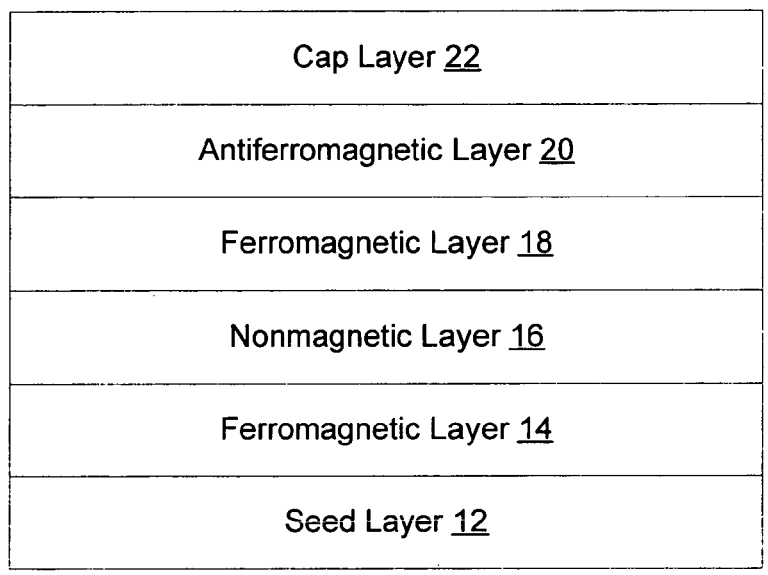
FIG. 1 is a schematic view of the layers of a spin valve, in accordance with an exemplary embodiment of the present invention.

FIG. 1 schematically illustrates the layers of an exemplary spin valve 10 that may be used in the present invention. It is to be understood that spin valve 10 may be formed on a substrate or on one or more other underlayers not shown in FIG. 1. For example, spin valve 10 may be formed on dielectric materials, such as silicon nitride or silicon oxide. Thus, spin valve 10 may include a seed layer 12, formed atop another layer (not shown), in order to facilitate the formation of the metal layers above it in spin valve 10. In an exemplary embodiment, seed layer 12 is a metal such as tantalum. The thickness of seed layer 12 may range from about 1 to 10 nanometers, depending on the materials used. Thus, in a typical example, seed layer 12 may be about 5 nanometers of tantalum.

A first ferromagnetic layer 14 is formed on seed layer 12. Ferromagnetic layer 14 serves as the "free" or "switching" layer in spin valve 10. Ferromagnetic layer 14 includes a ferromagnetic material, such as iron, nickel, cobalt and/or alloys thereof, such as NiFe, CoFe, NiFeCo, and NiFe/CoFe. The thickness of ferromagnetic layer 14 may, for example, be between 0.1 and 10 nanometers. A nonmagnetic layer 16 is formed on ferromagnetic layer 14. Nonmagnetic layer 16 is a nonmagnetic conductor, such as copper, with a thickness, for example, in the range of 0.5 to 4 nanometers.

A second ferromagnetic layer 18 is formed on nonmagnetic layer 16. Ferromagnetic layer 18 includes a ferromagnetic material, such as iron, nickel, cobalt and/or alloys thereof, such as NiFe, CoFe, NiFeCo, and NiFe/CoFe. The thickness of ferromagnetic layer may, for example, be between 0.1 and 10 nanometers. An antiferromagnetic layer 20 is formed on ferromagnetic layer 18. Antiferromagnetic layer 20 may include antiferromagnetic materials, such as FeMn alloys or PtMn alloys, and may have a thickness, for example, from 5 to 50 nanometers. Antiferromagnetic layer 20 pins the orientation of the magnetization of ferromagnetic layer 18. Thus, ferromagnetic layer 18 serves as the "pinned" or "reference" layer in spin valve 10.

Spin valve 10 may also include a cap layer 22 formed on antiferromagnetic layer 20. Cap layer 22 may include one or more layers provided for diffusion barriers, passivation, and/or in order to enhance the magnetoresistance of spin valve 10. In an exemplary embodiment, cap layer 22 may include a diffusion barrier consisting of a layer of tantalum about 1 to 5 nanometers thick. Spin valve 10 may also include other layers, depending on the particular application and/or method of fabrication. In addition, one or more other layers may be formed above and/or to the side of spin valve 10.

Figure 2:
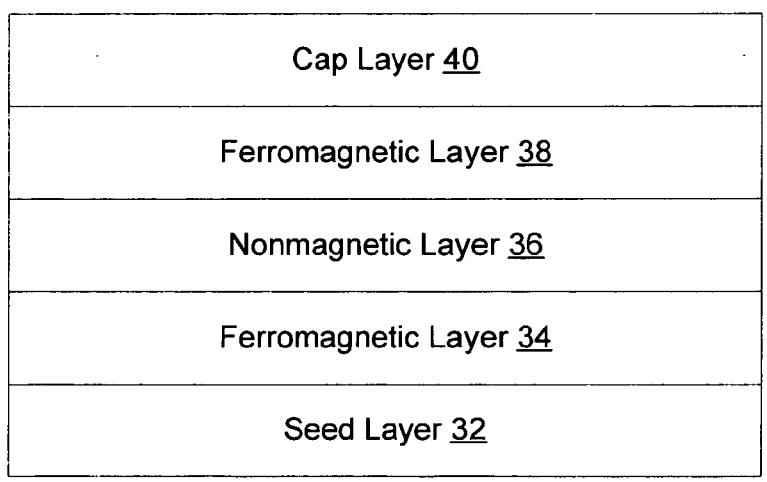
FIG. 2 is a schematic view of the layers of a pseudo spin valve, in accordance with an exemplary embodiment of the present invention.

FIG. 2 schematically illustrates the layers of an exemplary pseudo spin valve 30 that may be used in the present invention. The construction of pseudo spin valve 30 is similar to that of spin valve 10, except that no antiferromagnetic layer is included and the stacking of the switching and reference ferromagnetic layers is reversed. Thus, pseudo spin valve 30 may include a seed layer 32 to facilitate the formation of the metal layers of pseudo valve 30 above a dielectric layer, such as silicon nitride or oxide. Seed layer 32 may be about 5 nanometers of tantalum, for example. A first ferromagnetic layer 34 is formed on seed layer 32. Ferromagnetic layer 34 may serve as the fixed or reference layer in pseudo spin valve 30. Ferromagnetic layer 34 may include a material, such as Ni, Fe, Co, NiFe, CoFe, NiFeCo, and/or NiFe/CoFe, and may have a thickness, for example, between 0.1 to 10 nanometers. A nonmagnetic layer 36 is formed on ferromagnetic layer 34. Nonmagnetic layer 36 is a nonmagnetic conductor, such as copper, and may have a thickness in the range of 2.5 to 3.5 nanometers. A second ferromagnetic layer 38 is formed in nonmagnetic layer 36. Ferromagnetic layer 38 may serve as the free or switching layer in pseudo spin valve 30. Ferromagnetic layer 38 may include a material, such as Ni, Fe, Co, NiFe, CoFe, NiFeCo, and/or NiFe/CoFe, and may have a thickness, for example, between 0.1 to 10 nanometers. A cap layer 40 may be formed on ferromagnetic layer 38. Cap layer 40 may include one or more layers provided for diffusion barriers, passivation, and/or in order to enhance the magnetoresistance of pseudo spin valve 30. Cap layer 40 may, for example, include a diffusion barrier consisting of a layer of tantalum about 1 to 5 nanometers thick.

2. Exemplary Method of Fabrication

Figure 3:
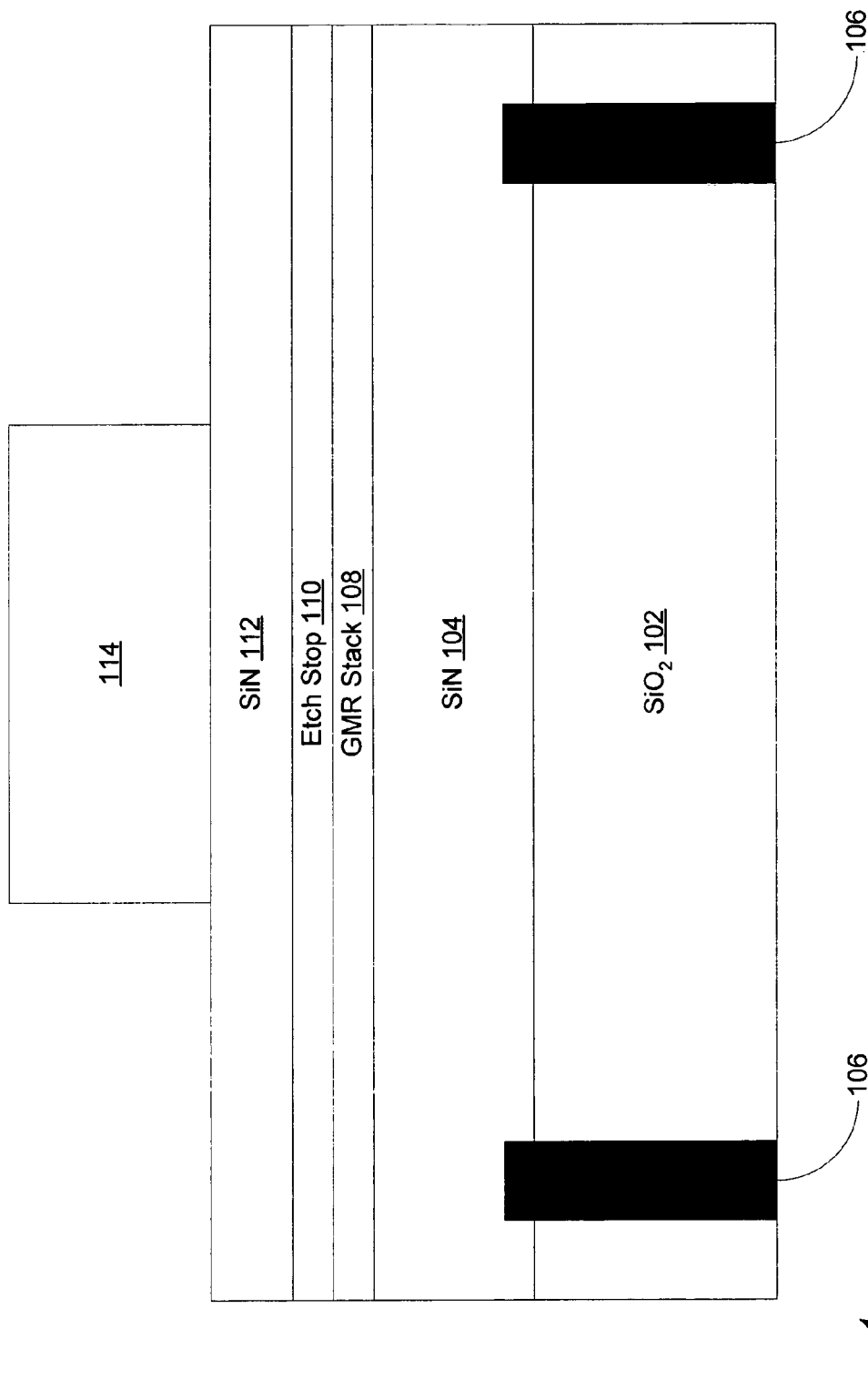
FIG. 3 is a schematic view showing a stage in the fabrication of a magnetoresistive device, in accordance with an exemplary embodiment of the present invention.

FIGS. 3 through 7 illustrate several stages in an exemplary method of fabricating a magnetic bit, e.g., for a magnetic memory. FIG. 3 illustrates a multilayered structure 100 that is ready to be patterned to define the configuration of the magnetic bite. In an exemplary embodiment, multilayered structure 100 includes a layer 102 of silicon oxide, e.g., $SiO_2$. Oxide layer 102 may be formed over one or more underlayers (not shown) that may include metal layers, semiconductor devices, and/or other circuitry. In an exemplary embodiment, oxide layer 102 includes about 2000 nanometers of PVD silicon oxide and about 1000 nanometers of CMP silicon oxide.

A first silicon nitride layer 104 is formed on oxide layer 102. In this example, first silicon nitride layer 104 is about 150 to 200 nanometers thick and is formed by PVD. First silicon nitride 104 may be provided as a spacer between oxide layer 102 and the magnetoresistive device layers above it, e.g., so that etching can extend below the level of the magnetoresistive device layers without immediately proceeding into oxide layer 102. First silicon nitride layer 104 may also serve as part of the oxygen barrier that protects the magnetoresistive layers from exposure to oxygen while oxide layer 102 is being etched, as described in more detail below.

Electrical contacts 106 may also extend through silicon oxide layer 102 and into silicon nitride layer 104. In an exemplary embodiment, electrical contacts 106 may comprise plugs of a conductive material, such as tungsten, filled into vias formed in silicon oxide layer 102 and may serve as electrical interconnects with metal layers, circuitry, or other layers below oxide layer 102.

Magnetoresistive device layers 108 are formed on first silicon nitride layer 104. In a preferred embodiment, magnetoresistive device layers 108 comprise the layers for a GMR device, such as a spin valve or a pseudo spin valve, and, thus, may be referred to herein as a "GMR stack." Thus, magnetoresistive device layers 108 may include the layers shown in FIG. 1, for a spin valve, or may include the layers shown in FIG. 2, for a pseudo spin valve. Magnetoresistive device layers 108 may be formed using one or more deposition techniques, such as chemical vapor deposition (CVD), low-pressure CVD (LPCVD), plasma vapor deposition (PVD), molecular beam epitaxy (MBE), sputtering, and/or ion beam deposition (IBD).

An etch stop 110 is formed on magnetoresistive layers 108. In a preferred embodiment, etch stop is titanium nitride (TiN). In an exemplary embodiment, the TiN layer is about 5 to 50 nm thick and may be deposited through low-temperature PVD. Alternatively, other materials, such as chromium silicon (CrSi), aluminum nitride (AlN), or tantalum nitride (TaN) could be used as etch stop 110.

A second silicon nitride layer 112 is formed on etch stop 110. Preferably, second silicon nitride layer 112 is thinner than first silicon nitride layer 104. Thus, in this example, second silicon nitride layer 112 may be about 10 to 100 nanometers thick. Second silicon nitride layer 112 may be formed by PVD, for example.

Figure 4:
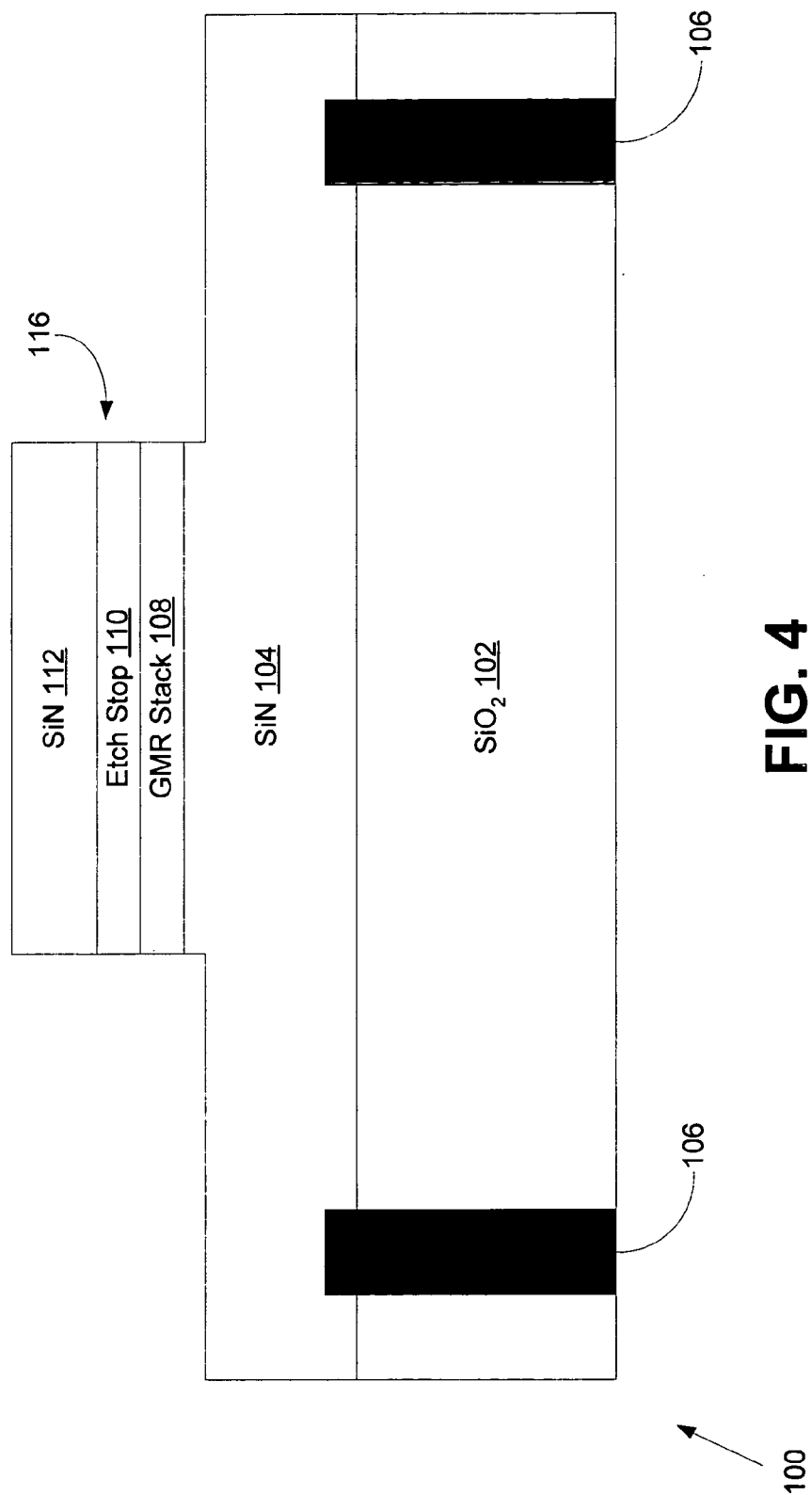
FIG. 4 is a schematic view showing a stage in the fabrication of a magnetoresistive device, in accordance with an exemplary embodiment of the present invention.

A photoresist layer 114 is formed on second silicon nitride layer 112 in order to pattern the magnetic bit. In an exemplary embodiment, as illustrated in FIG. 3, ion milling is used for this patterning, with photoresist layer 114 serving as a masking layer. After ion milling, photoresist layer 114 is removed. FIG. 4 shows the configuration multilayered structure 100 after ion milling and removal of photoresist layer 114. As shown in FIG. 4, the ion milling defines sidewalls 116 of GMR stack 108, etch stop 110, and second silicon nitride layer 112. The ion milling may also extend partly into first silicon nitride layer 104.

Figure 3A:
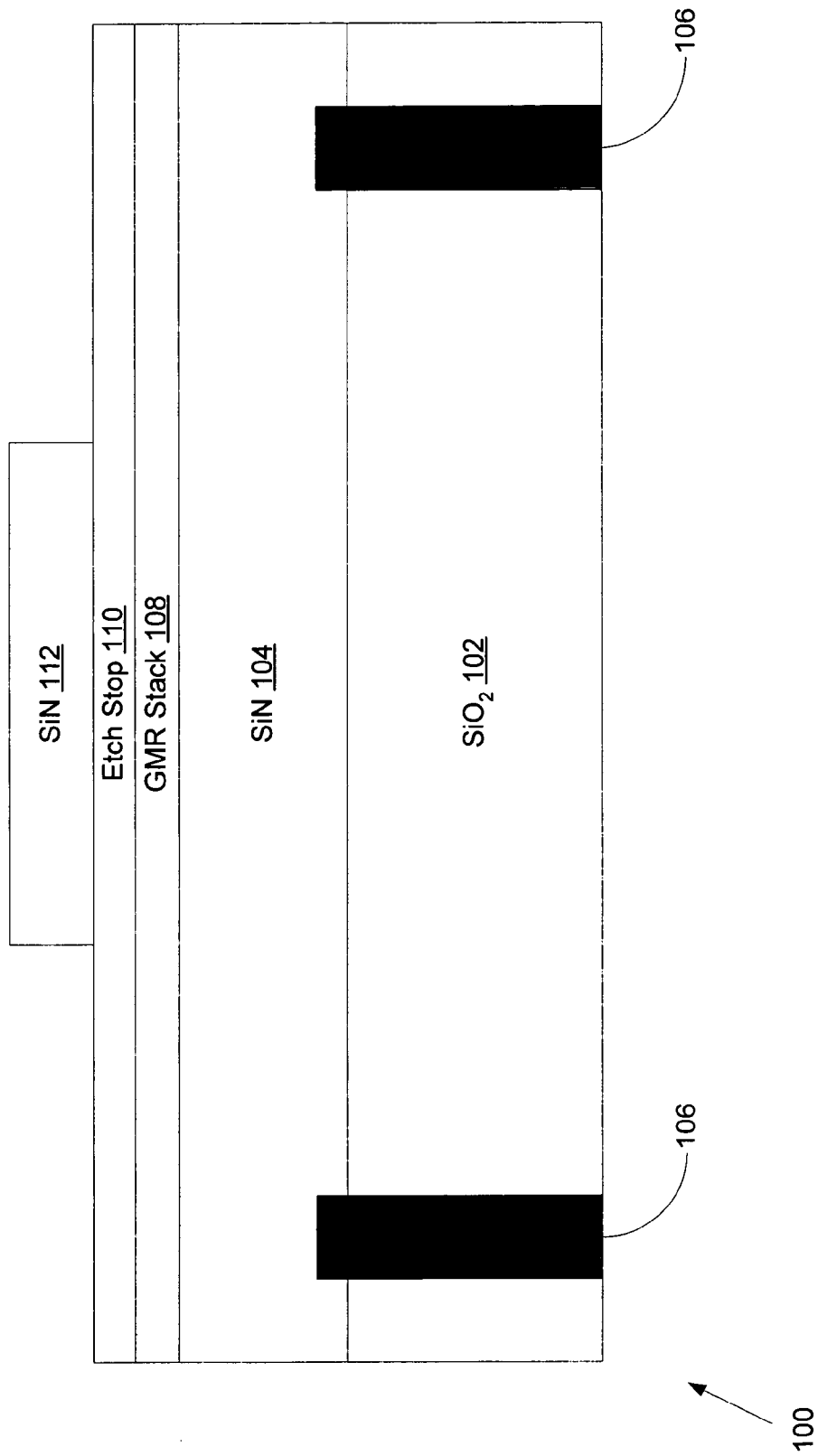
FIG. 3A is a schematic view showing a stage in the fabrication of a magnetoresistive device, in accordance with an exemplary embodiment of the present invention.

FIG. 3A illustrates an alternative approach to forming the construction shown in FIG. 4. In this alternative approach, photoresist layer 114 is used as a masking to pattern second silicon nitride layer 112. After this patterning, photoresist layer 114 is removed. The patterned silicon nitride layer 112, as shown in FIG. 3A, is then used as a masking layer for the ion milling that results in the construction shown in FIG. 4.

Figure 5:
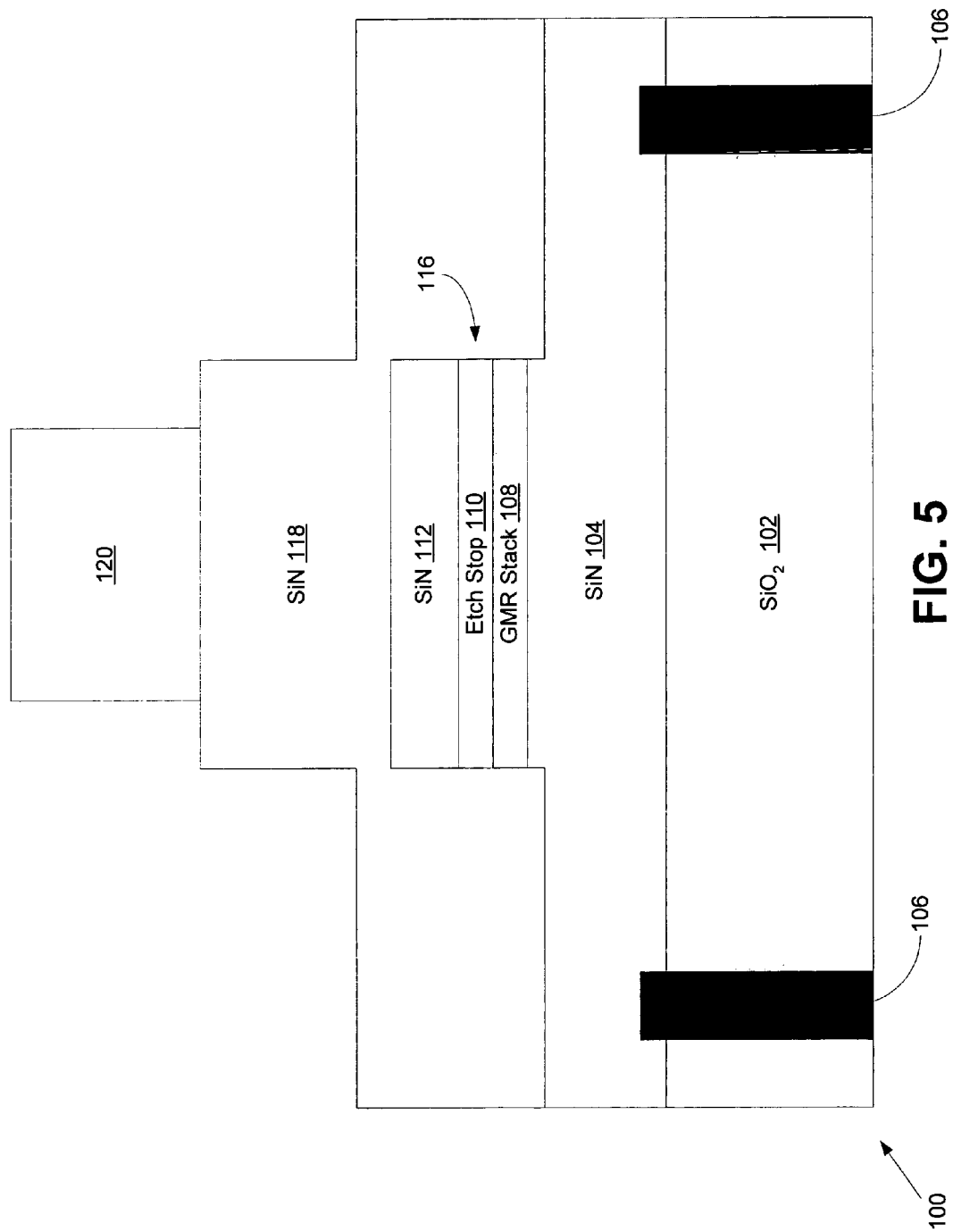
FIG. 5 is a schematic view showing a stage in the fabrication of a magnetoresistive device, in accordance with an exemplary embodiment of the present invention.

In the next stage, a third silicon nitride layer 118 may be formed on first silicon nitride layer 104 and second silicon nitride layer 112, as shown in FIG. 5, e.g., to serve as a masking layer and to provide additional protection during subsequent etching. In an exemplary embodiment, third silicon nitride layer 118 is about 100 to 200 nanometers thick and is formed by a vapor deposition process, such as CVD or PVD. A photoresist layer 120 is formed on third silicon nitride layer 118 as a masking layer for further patterning to open electrical contacts to the magnetic bit.

In an exemplary embodiment, plasma etching, such as reactive ion etching (RIE), can be used for the patterning. The etching extends through third silicon nitride layer 118 and second silicon nitride layer 112 to expose electrical contact surfaces 122 on etch stop 110. The etching may also extend part of the way through first silicon nitride layer 104.

Figure 6:
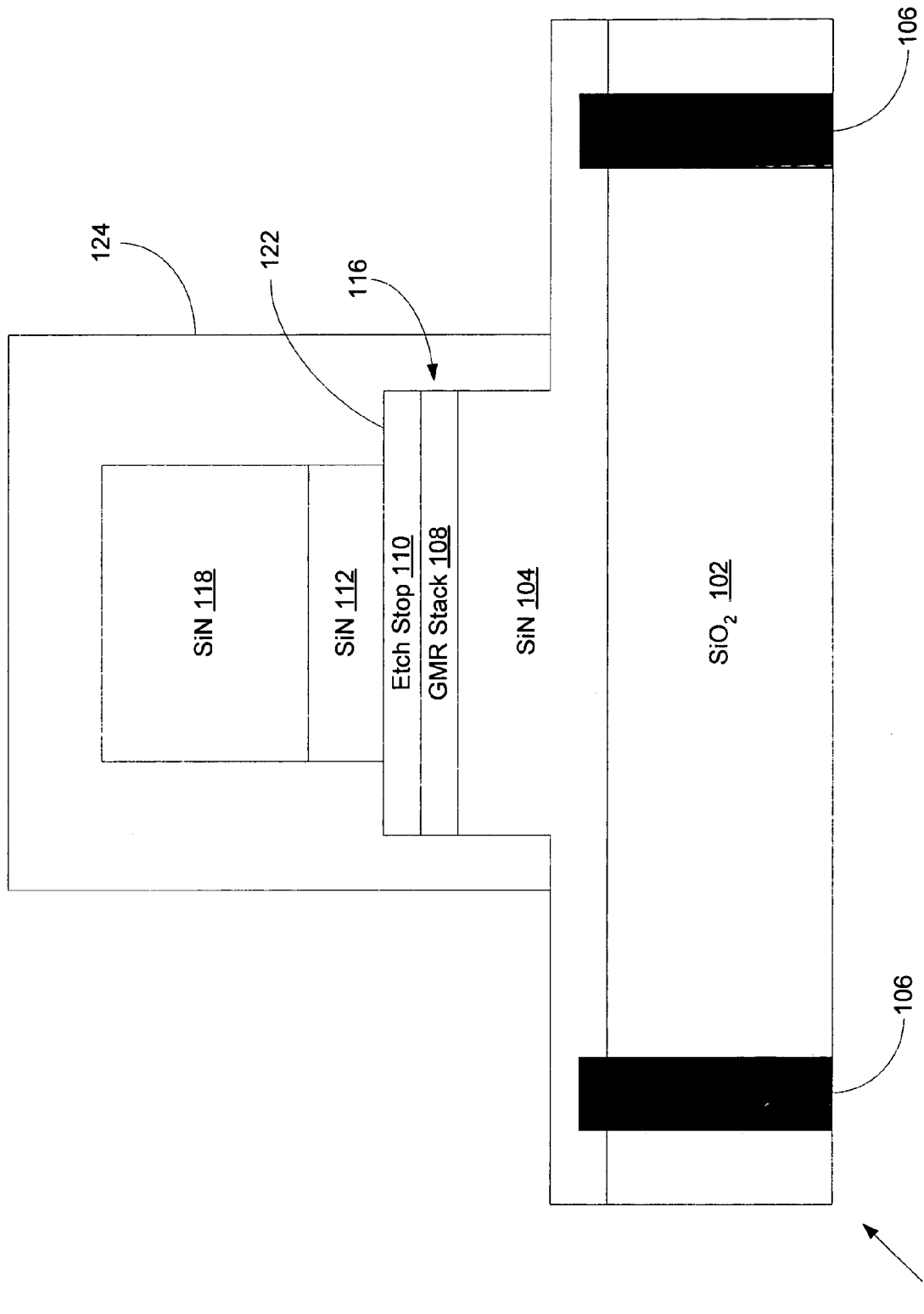
FIG. 6 is a schematic view showing a stage in the fabrication of a magnetoresistive device, in accordance with an exemplary embodiment of the present invention.
Figure 7:
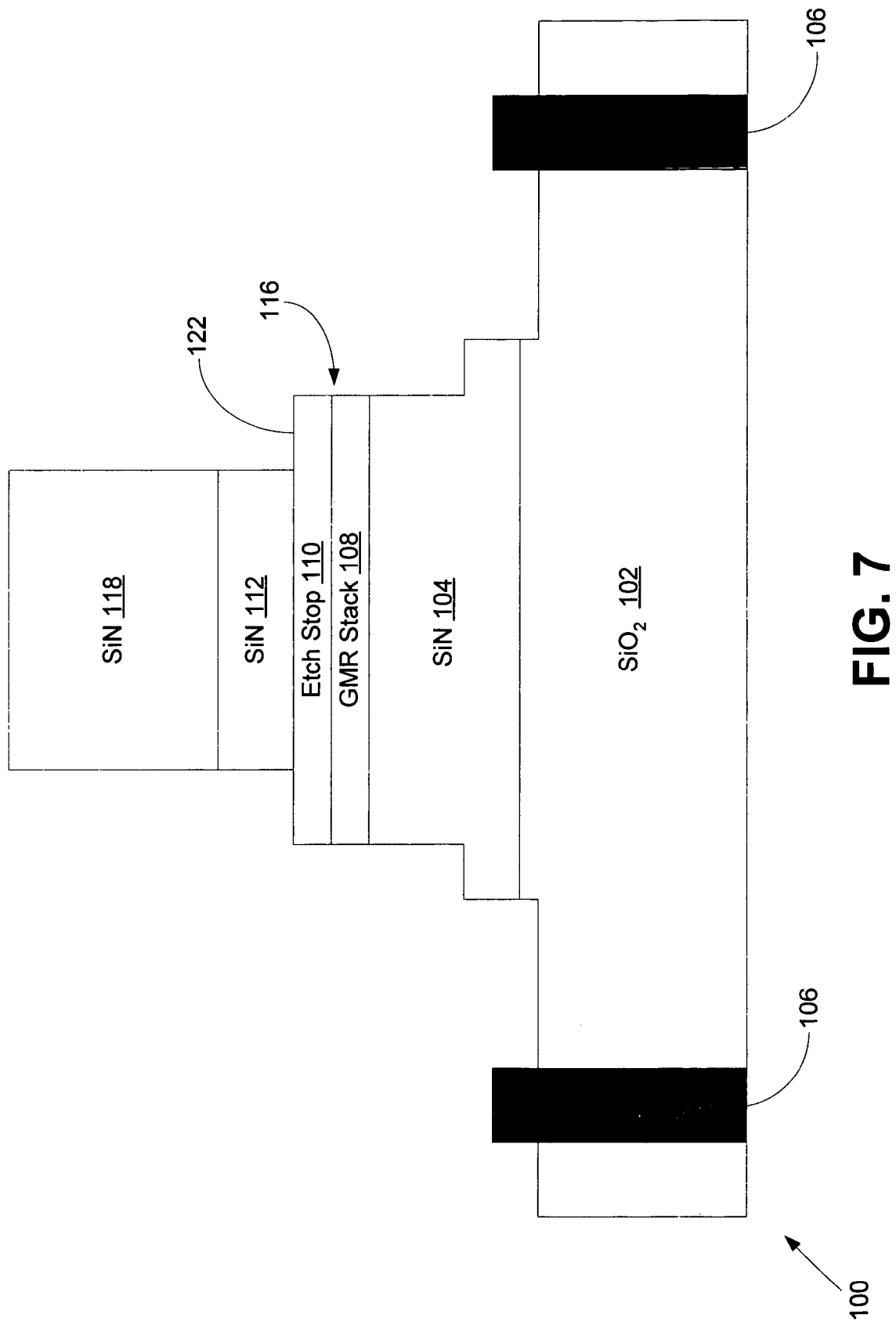
FIG. 7 is a schematic view showing a stage in the fabrication of a magnetoresistive device, in accordance with an exemplary embodiment of the present invention.

A photoresist layer 124 is then applied so as to surround silicon nitride layers 118 and 112, etch stop 110, and magnetoresistive device layers 108, as shown in FIG. 6. In particular, photoresist layer 124 covers sidewalls 116 of magnetoresistive device layers 108 and etch stop 110. In an exemplary embodiment, RIE is used to etch into silicon nitride layer 104 and silicon oxide layer 102 to expose electrical contacts 106. After this etching, photoresist layer 124 is removed. FIG. 7 shows the configuration of multilayered structure 100 after this etching and removal of photoresist layer 124. In subsequent processing steps, one or more metallization layers may be deposited and etched to form electrically conductive pathways between magnetoresistive device layers 108 and electrical contacts 106.

It has been found that etching into silicon oxide layer 102 can release oxygen that can adversely affect the layers in or in proximity to the magnetic bit, including, for example, magnetoresistive device layers 108. Beneficially, however, the presence of photoresist layer 124 can substantially reduce the adverse affects of oxygen released during the etching into silicon oxide layer 102. In particular, photoresist layer 124 and first silicon nitride layer 104 together act as an oxygen barrier to protect the magnetic bit, including magnetoresistive device layers 108, from exposure to oxygen.

3. CONCLUSION

Exemplary embodiments of the present invention have been described above. Thus, references to specific thicknesses, materials, and fabrication methods are meant to be illustrative rather than limiting. Those skilled in the art will understand that changes and modifications may be made to these embodiments without departing from the true scope and spirit of the invention, which is defined by the claims.

What is claimed is:

1. A method of fabrication for a magnetoresistive device, said method comprising:

forming an oxide layer;

forming a plurality of magnetoresistive device layers above said oxide layer;

forming an etch stop above said magnetoresistive device layers;

surrounding said magnetoresistive device layers with an oxygen barrier; and etching into said oxide layer while said magnetoresistive device layers are surrounded by said oxygen barrier.

2. The method of claim 1, wherein said oxide layer comprises silicon oxide.

3. The method of claim 2, wherein said oxygen barrier comprises a photoresist layer.

4. The method of claim 3, wherein said oxygen barrier further comprises a silicon nitride layer.

5. The method of claim 1, wherein forming a plurality of magnetoresistive device layers comprises:

forming at least one ferromagnetic layer.

6. The method of claim 1, wherein forming a plurality of magnetoresistive device layers comprises:

forming a plurality of ferromagnetic layers; and forming at least one nonmagnetic layer.

7. The method of claim 6, wherein said magnetoresistive device layers comprise a spin valve.

8. The method of claim 6, wherein said magnetoresistive device layers comprise a pseudo spin valve.

9. The method of claim 1, wherein said etch stop comprises titanium nitride.

10. The method of claim 1, wherein etching into said oxide layer comprises:
  etching into said oxide layer to expose at least one electrical contact.

11. The method of claim 10, further comprising:
  removing at least part of said oxygen barrier; and
  forming at least one electrically conductive path between said magnetoresistive device layers and said at least one electrical contact.

* * * * *